(12) United States Patent
Lin et al.

(10) Patent No.: US 12,417,721 B2
(45) Date of Patent: Sep. 16, 2025

(54) TILING DISPLAY APPARATUS

(71) Applicant: AUO Corporation, Hsin-Chu (TW)

(72) Inventors: Yi-Hsin Lin, Hsin-Chu (TW);
Wen-Lung Chen, Hsin-Chu (TW);
Wei-Lung Liau, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 430 days.

(21) Appl. No.: 18/089,001

(22) Filed: Dec. 27, 2022

(65) Prior Publication Data

US 2023/0222947 A1 Jul. 13, 2023

(30) Foreign Application Priority Data

Jan. 10, 2022 (TW) .................................. 111100912

(51) Int. Cl.
*G09F 9/302* (2006.01)
*G09F 9/33* (2006.01)
(Continued)

(52) U.S. Cl.
CPC .............. *G09F 9/3026* (2013.01); *G09F 9/33* (2013.01); *H01L 25/0753* (2013.01); *H10H 20/853* (2025.01)

(58) Field of Classification Search
CPC .... H10K 59/18; H10H 20/857; G09F 9/3026; G09F 9/33; G09G 3/32; H01L 25/167; H01L 25/075; H01L 25/0753
See application file for complete search history.

(56) References Cited

U.S. PATENT DOCUMENTS

2015/0228704 A1* 8/2015 Miyake ................... H01K 1/00
257/40
2020/0111391 A1 4/2020 Chao et al.
(Continued)

FOREIGN PATENT DOCUMENTS

TW 1763463 B 5/2022
WO 2020151257 A1 7/2020

OTHER PUBLICATIONS

Office Action issued by the State Intellectual Property Office of the Peoples Republic of China on Jun. 3, 2023 for Application No. 202210519308.1, China.
(Continued)

*Primary Examiner* — Antonio B Crite
(74) *Attorney, Agent, or Firm* — Tim Tingkang Xia, Esq.; Troutman Pepper Locke LLP (57) ABSTRACT

A tiling display apparatus including a substrate, multiple display units, an adhesive layer and multiple driver chips is provided. The display units are disposed on the substrate and each has a circuit substrate, multiple light emitting devices and at least one bonding pad. The circuit substrate has a first surface and a second surface opposite to each other. The light emitting devices are disposed on the first surface. The at least one bonding pad is disposed on the second surface, and is electrically coupled to the light emitting devices. The adhesive layer connects the substrate and the display units. The substrate and the adhesive layer have a plurality of openings arranged corresponding to the openings. Multiple bonding pads of the display units are positioned in the openings. The driver chips are electrically bonded to the bonding pads of the display units through the openings.

19 Claims, 9 Drawing Sheets

(51) Int. Cl.
    *H01L 25/075*      (2006.01)
    *H01L 25/16*      (2023.01)
    *H10H 20/853*      (2025.01)
    *H10H 20/857*      (2025.01)

(56) References Cited

U.S. PATENT DOCUMENTS

| | | | |
|---|---|---|---|
| 2020/0111771 A1 | 4/2020 | Su et al. | |
| 2021/0217806 A1 | 7/2021 | Xi et al. | |
| 2021/0265457 A1* | 8/2021 | Yueh | H10K 59/18 |
| 2022/0392990 A1* | 12/2022 | Shin | H10K 59/18 |

OTHER PUBLICATIONS

Office Action issued by (TIPO) Intellectual Property Office Ministry of Economic Affairs R.O.C. on Dec. 13, 2022 for Application No. 111100912, Taiwan.

\* cited by examiner

TILING DISPLAY APPARATUS

CROSS-REFERENCE TO RELATED PATENT APPLICATION

This non-provisional application claims priority to and the benefit of, pursuant to 35 U.S.C. § 119(a), patent application Serial No. 111100912 filed in Taiwan on Jan. 10, 2022. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a display apparatus, and particularly to a tiling display apparatus.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the various applications of the display apparatus, the use of large display panels used for displaying public information or advertisements in large exhibition halls or department stores has become increasingly popular. To reduce the installation cost and maintenance cost of the large display panels, a tiling display apparatus formed by tiling a plurality of display panels has become one of the common methods for such large display panels. Generally, a plurality of display panels (such as light emitting diode panels) cannot be arranged tightly in the tiling process due to the tiling accuracy, resulting in slits between these display panels to be easily formed after tiling. The slits may increase the image discontinuity (such as dark lines) of the tiling display image, thereby reducing the display quality. Thus, how the above-mentioned problem can be solved has become one of the issues to be addressed for the manufacturers in the process of developing the tiling display technology.

SUMMARY

The present disclosure provides a tiling display apparatus, which has a higher tiling accuracy of the display units and better tiling display effect thereof.

In one embodiment of the present disclosure, a tiling display apparatus includes a substrate, a plurality of display units, an adhesive layer and a plurality of driver chips. The display units are disposed on the substrate, and each display unit has a circuit substrate, a plurality of light emitting devices and at least one bonding pad. The circuit substrate has a first surface and a second surface opposite to each other. The light emitting devices are disposed on the first surface. The at least one bonding pad is disposed on the second surface and is electrically coupled to the light emitting devices. The adhesive layer connects the substrate and the display units. The substrate and the adhesive layer have a plurality of openings disposed corresponding to the display units, and the bonding pads of the display units are located in the openings. The driver chips are electrically bonded to the bonding pads of the display units through the openings.

Based on the foregoing, in the tiling display apparatus according to one embodiment of the present disclosure, the substrate and the adhesive layer being used to tile the display units have the openings disposed corresponding to the display units, and the driver chips are electrically bonded to the display units through the openings. In addition, in the tiling process of the display units, the openings may function as alignment marks simultaneously, thus contributing to increasing the tiling accuracy of the display units. In other words, the widths of the tiling gaps of the display units can be reduced, thereby reducing the discontinuity of the tiling display image.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Considering the measurement discussed and specific quantities of errors related to the measurement (that is, the limitation of the measuring system), the terms "about", "approximately" or "substantially" as used herein shall mean the value described and an average value in an acceptable deviation range of the specific values ascertained by one of ordinary skill in the art. For example, the term "about" represents within one or more standard deviations of a given value of range, or within ±30 percent, within ±20 percent, within ±15 percent, within ±10 percent or within ±5 percent. Moreover, the terms "about", "approximately" or "substantially" as used herein may selectively refer to a more acceptable deviation range or the standard deviation based on the measurement characteristics, the cutting characteristics or other characteristic, without applying one standard deviation to all characteristics.

In the contents described below, sectional schematic views are referred to as preferred embodiments for describing the exemplary embodiments. Thus, the description and explanation of the exemplary embodiments as described below are not limited to the shapes of the regions as described in the contents, and deviations of the shapes serving as a result of manufacturing may be expected. For example, a surface shown or described as being flat may generally have rough and/or non-linear features, and an acute angle shown in the figures may be round. Therefore, the regions as shown in the figures are essentially schematic, and shapes thereof are not intended to show the accurate shapes of the regions, and are not intended to limit the scope of the claims of the present disclosure.

The exemplary embodiments of the present disclosure are further described in detail below with reference to the accompanying drawings. Referring to the drawings, identical numbers, if any, indicate identical or similar portions throughout the views.

Figure 1:
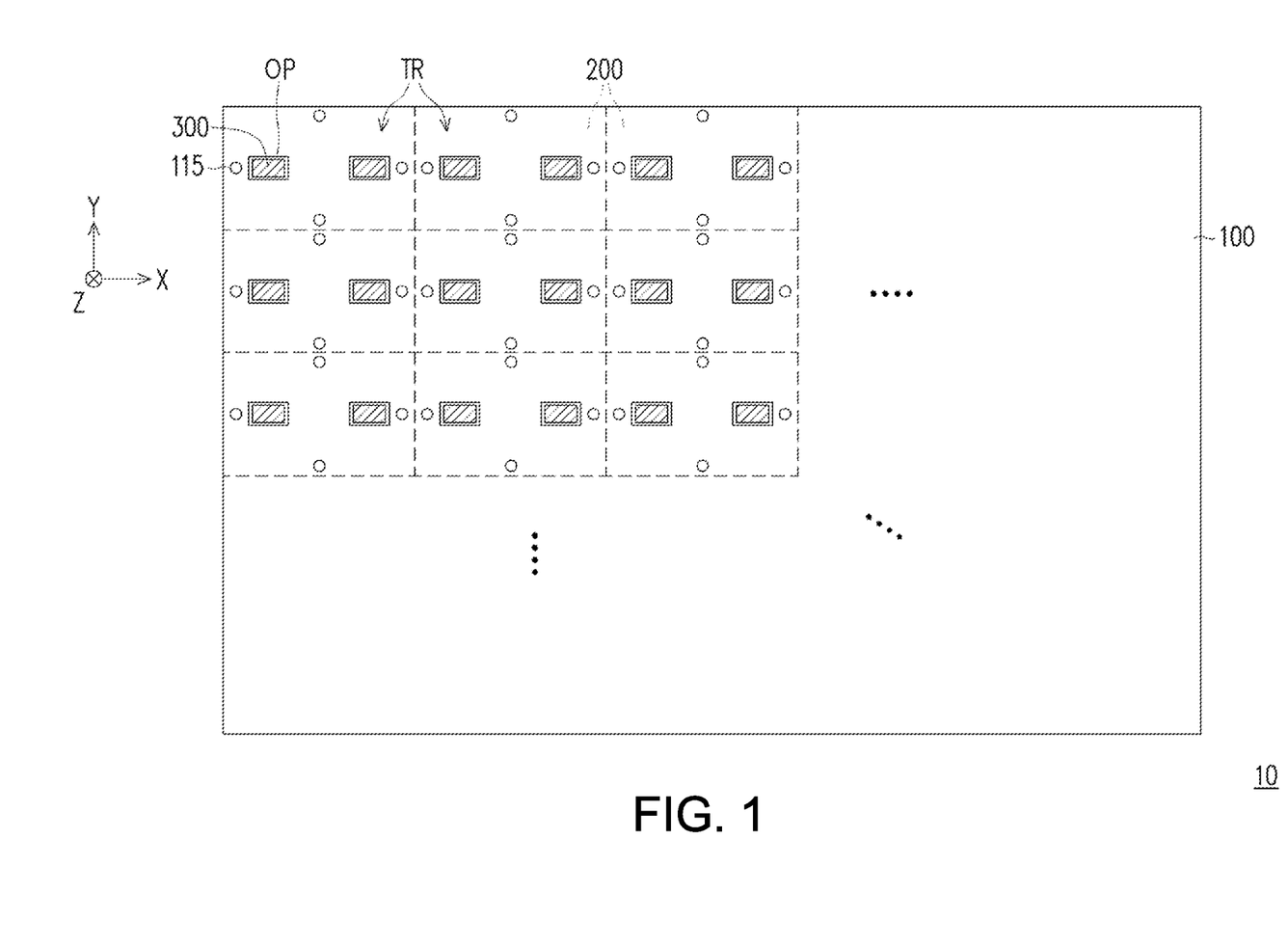
FIG. 1 is a top schematic view of a tiling display apparatus according to one embodiment of the present disclosure.
Figure 2:
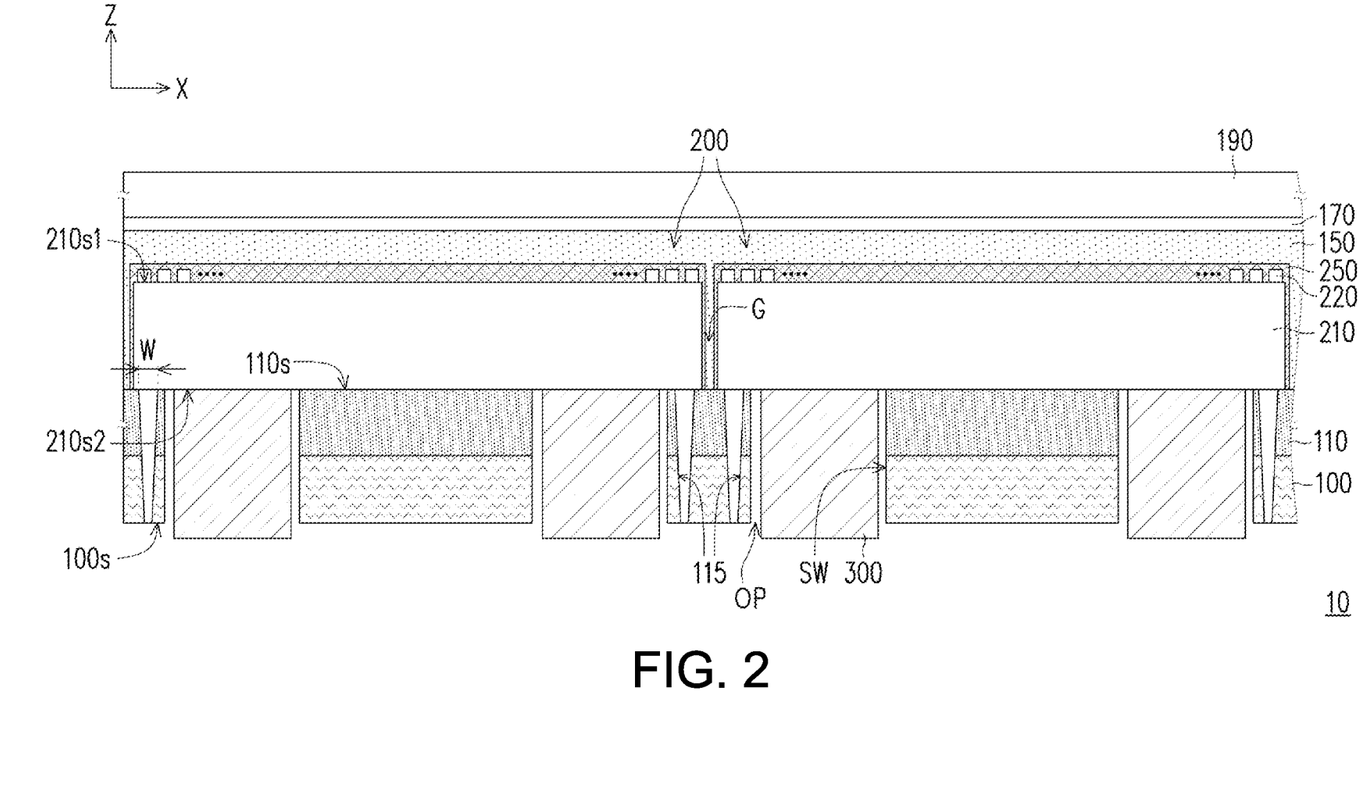
FIG. 2 is a sectional schematic view of the tiling display apparatus of FIG. 1.
Figure 3:
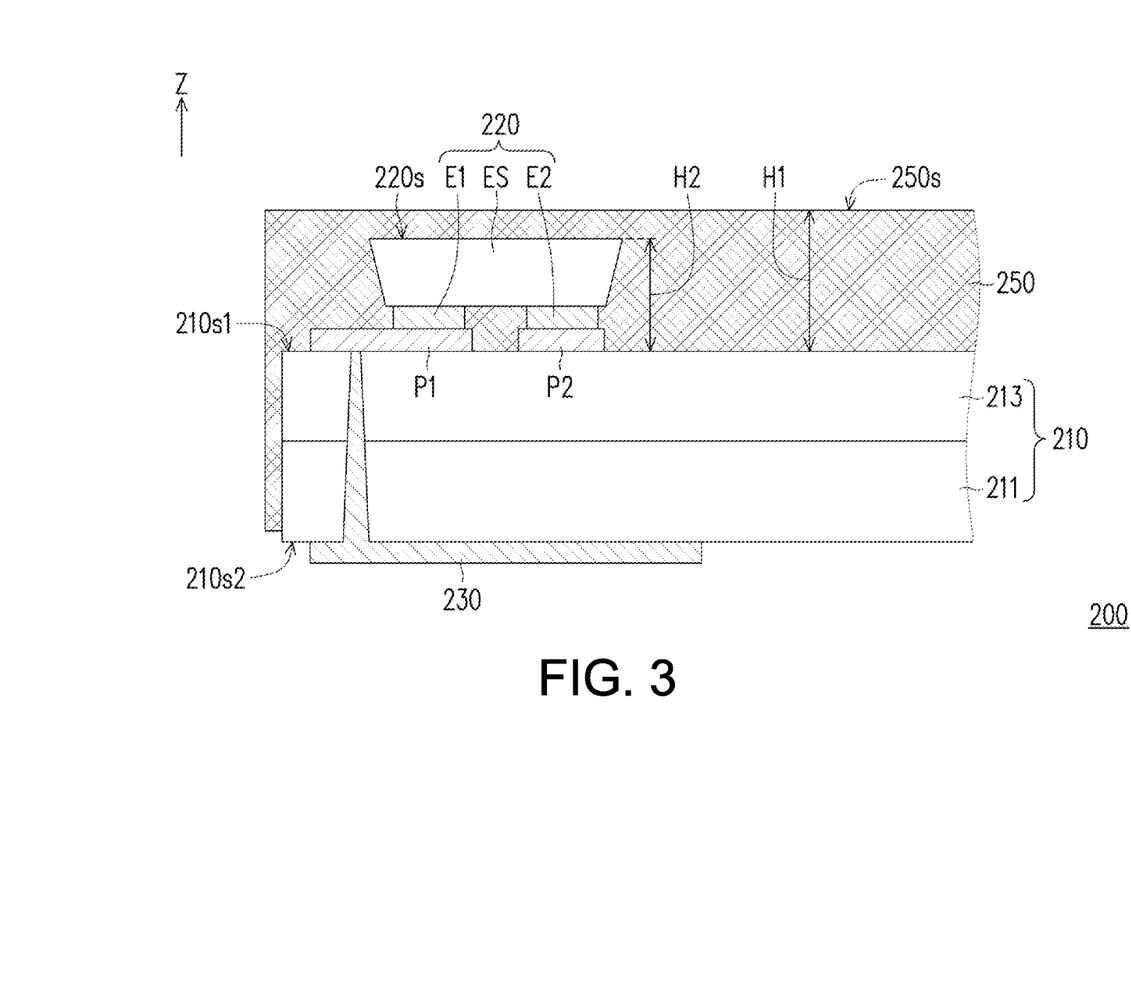
FIG. 3 is a sectional schematic view of the display unit of FIG. 2.

FIG. 1 is a top schematic view of a tiling display apparatus according to one embodiment of the present disclosure. FIG. 2 is a sectional schematic view of the tiling display apparatus of FIG. 1. FIG. 3 is a sectional schematic view of the display unit of FIG. 2. FIG. 4A to FIG. 4F are sectional schematic views of a manufacturing process of the tiling display apparatus of FIG. 2.

Referring to FIG. 1 to FIG. 3, the tiling display apparatus 10 includes a substrate 100, an adhesive layer 110, a plurality of display units 200 and a plurality of driver chips 300. The display units 200 are disposed on the substrate 100, and the adhesive layer 110 connects the substrate 100 and the display units 200. For example, the display units 200 may be arranged in a plurality of rows and a plurality of columns along a direction X and a direction Y. That is, the display units 200 may be arranged on the substrate 100 in an array, without being limited thereto. In other embodiments, the display units may be arranged tightly by being staggered from each other, such as being arranged in a honeycomb shape. In this embodiment, the orthogonal projection contours of the display units 200 on the substrate 100 may be, for example, rectangular-shaped, but are not limited thereto. To satisfy the tiling requirements under different usage circumstances, the outer contours of the display units in a display direction (such as a direction Z) may include curved sections (such as being semicircular-shaped or semielliptical-shaped), polyline sections (such as being regular hexagonal-shaped), or a combination thereof, or other shapes suitable for tiling.

In this embodiment, the substrate 100 may be a glass substrate (such as a soda-lime glass substrate), a hard substrate in other materials (such as alkali-free glass, quartz, a silicon substrate, a sapphire substrate, or other suitable materials), or a flexible soft substrate (such as a polymer substrate with PI, PET, etc., or a thin metal/glass substrate). The material of the adhesive layer 110 may be, for example, silicone rubber materials, epoxy or acrylic materials.

Further, each display unit 200 includes a circuit substrate 210, a plurality of light emitting devices 220 and at least one bonding pad 230. The circuit substrate 210 has a first surface 210s1 and a second surface 210s2 opposite to each other. The light emitting devices 220 are disposed on one side of the first surface 210s1 of the circuit substrate 210. The bonding pad 230, which is used for bonding the driver chips 300, is disposed on one side of the second surface 210s2 of the circuit substrate 210, and is electrically coupled to the light emitting devices 220. The bonding pad 230 may be, for example, a bonding pin, but is not limited thereto. It should be noted that, although FIG. 3 illustrates only one bonding pad 230, the present disclosure is not limited to the quantity thereof. The quantity of the bonding pads 230 of each display unit may be adjusted according to the actual product design (such as the size of each display unit, the resolution thereof, or the driving circuit design, etc.).

In this embodiment, the circuit substrate 210 may include a base plate 211 and a driving circuit layer 213 disposed on the base plate 211. For example, the driving circuit layer 213 may selectively include a plurality of active components (not illustrated) and at least one circuit line (not illustrated) manufactured in a conductive film layer, but is not limited thereto. In other embodiments, the driving circuit layer 213 may be disposed with only a plurality of circuit lines, and the light emitting components 220 of each display unit 200 may be electrically coupled with outer control chips through the circuit lines, thus individually controlling the light emitting components 220 to emit light.

In details, the driving circuit layer 213 may be disposed with a conductive pad assembly, such as an assembly of a first conductive pad P1 and a second conductive pad P2, and the light emitting components 220 may be electrically bonded to the conductive pad assembly to facilitate the electrical connection relationship with the driving circuit layer 213. The light emitting components 220 may include an epitaxy structural layer ES, a first electrode E1 and a second electrode E2. The first electrode E1 and the second electrode E2 are disposed at a same side of the epitaxy structural layer ES, and are electrically bonded to the first conductive pad P1 and the second conductive pad P2 respectively. In the present embodiment, the bonding pad 230 located on the second surface 210s2 of the circuit substrate 210 may run through the circuit substrate 210 to be electrically connected to the first conductive pad P1, and the second conductive pad P2 may be electrically coupled to another bonding pad that is not illustrated through the circuit lines (or the driving circuit), but is not limited thereto. In another unillustrated embodiment, a side wall of the circuit substrate connecting the first surface 210s1 and the second surface 210s2 may be disposed with a side edge lines, and the side edge lines are used to electrically connect the first conductive pad P1 located on the first surface 210s1 and the bonding pad 230 located on the second surface 210s2. In other words, in the embodiment, the circuit substrate utilizes the side edge lines to replace the conductive through hole in FIG. 3 to facilitate the electrical connection relationship of the conductive pad and the bonding pad.

The epitaxy structural layer ES herein may be, for example, a stack structure of a P-type semiconductor layer, a light emitting layer and an N-type semiconductor layer, and the first electrode E1 and the second electrode E2 are electrically connected to the P type semiconductor layer and the N-type semiconductor layer respectively. More specifically, the light emitting devices 220 may be flip-chip type light emitting diodes, but are not limited thereto. In other embodiments, the display units may be manufactured by adopting light emitting devices with different types, such as vertical type light emitting devices or lateral type light emitting devices.

On the other hand, the display units 200 may have different light colors (such as red, green and blue), but are not limited thereto. In other embodiments, the light emitting devices 220 of the display units may only have a single light color, and the light emitting surfaces of at least a portion of the light emitting devices are disposed with wavelength converting layers to generate light in different colors.

To reduce the visibility of the circuit line of the driving circuit layer 213, each display unit 200 may selectively include a first encapsulating adhesive layer 250. The first encapsulating adhesive layer 250 covers the light emitting devices 220 and a portion of the first surface 210s1 of the circuit substrate 210. The first encapsulating adhesive layer 250 may be formed by a single encapsulating material or a stack structure having a plurality of encapsulating materials.

The first encapsulating adhesive layer 250 has an encapsulating surface 250s, and a first height H1 exists between the encapsulating surface 250s and the first surface 210s1 of the circuit substrate 210 along a normal direction of the first surface 210s1 (such as the direction Z). Each light emitting device 220 has a light emitting surface 220s, and a second height H2 exists between the light emitting surface 220s and the first surface 210s1 of the circuit substrate 210 along the normal direction of the first surface 210s1. In this embodiment, the first height H1 is greater than the second height H2, and the first encapsulating adhesive layer 250 covers the light emitting surfaces 220s of the light emitting devices 220, without being limited thereto. In other embodiments not being illustrated, the encapsulating surface 250s may be substantially flush with the light emitting surfaces 220s of the light emitting devices 220. That is, the first height H1 is equal to the second height H2.

It should be particularly noted that the substrate 100 and the adhesive layer 110 have a plurality of openings OP disposed corresponding to the display units 200, and the bonding pads 230 of the display units 200 are disposed in the openings OP. Thus, the driver chips 300 may be electrically bonded to the corresponding bonding pads 230 through the openings OP. In the present embodiment, the driver chips 300 do not overlap with the portions of the substrate 100 and the adhesive layer 110 defining the openings OP along a normal direction of the second surface 210s2 (such as the direction Z). In other words, in the present embodiments, the driver chips 300 are respectively disposed in the openings OP. However, the present disclosure is not limited thereto. According to other embodiments, the driver chips may extend out of the openings OP and overlap with the portions of the substrate 100 and the adhesive layer 110 defining the openings OP.

In the present embodiment, the driver chips 300 are not in contact with the side walls SW of the substrate 100 and the adhesive layer 110 defining the openings OP. In other words, gaps exist between the side walls SW of the substrate 100 and the adhesive layer 110 and the driver chips 300.

In the present embodiments, each driver chip 300 may be, for example, a flexible printed circuit boards (FPC), a chip on film (COF), or other suitable control circuit units. It should be noted that in FIG. 1, in the substrate 100 and the adhesive layer 110, the quantities of the openings OP and the driver chips 300 disposed in the tiling region TR corresponding to each display unit 200 are two as an example for illustrative descriptions, without limiting the present disclosure thereto. In other embodiments, the quantity of the openings OP may be one or three or more, and the quantity of the driver chips disposed in each opening OP may be plural. On the other hand, the normal projection contour of each opening OP onto the substrate 100 may be rectangular (as shown in FIG. 1) or other suitable geometrical shapes, without limiting the present disclosure thereto.

It should be noted that the openings OP are disposed to function as the bonding channels of the driver chips 300 and the display units 200, and also function as the alignment marks of the display units 200 in tiling alignment, thus effectively enhancing the tiling accuracy of the display units 200, and further reducing the width of the tiling gap G (as shown in FIG. 2) between any two adjacent display units 200. In other words, the discontinuity of the tiling display image may be reduced.

On the other hand, to further enhance the tiling accuracy, the substrate 100 and the adhesive layer 110 may further be disposed with a plurality of positioning holes 115. For example, the substrate 100 and the adhesive layer 110 are disposed with four positioning holes 115 in the tiling region TR of each display unit 200, and the four positioning holes 115 are respectively disposed to be near the center location of the four boundaries defining the tiling region TR, without being limited thereto. In other embodiments, the disposing locations of the positioning holes 115 may be adjusted based on the actual product design or manufacturing process requirements.

The substrate 100 and the adhesive layer 110 respectively have a substrate surface 100s and an adhesive surface 110s facing away from each other. In the present embodiment, the positioning holes 115 run from the substrate surface 100s through the substrate 100 and the adhesive layer 110 and extends to the adhesive surface 110s. That is, the positioning holes 115 in the present embodiment are through holes. However, the present disclosure is not limited thereto. In another embodiment not being illustrated, the positioning holes may be blind holes. For example, the positioning holes may be disposed only on the substrate 100 or the adhesive layer 110, or may run through the adhesive layer 110 but do not run through the substrate 100.

It should be particularly noted that, in the present embodiment, the width of each positioning hole 115 along a direction parallel to the substrate 100 (such as the direction X or the direction Y) gradually decreases from the adhesive surface 110s toward the substrate surface 100s. On the other hand, the normal projection contour of each positioning hole 115 onto the substrate 100 may be circular (as shown in FIG. 1) or other suitable geometrical shapes, without limiting the present disclosure thereto.

The tiling display apparatus 10 may selectively include a second encapsulating adhesive layer 150. It should be particularly noted that the second encapsulating adhesive layer 150 not only covers the display units 200, but also is filled in the tiling gaps G between the display units 200. Thus, by adjusting the optical density (OD) of the second encapsulating adhesive layer 150, the visibility of the tiling gaps G may be further reduced. For example, in the present embodiment, the optical density of the second encapsulating adhesive layer 150 may be less than the optical density of the first encapsulating adhesive layer 250.

Figure 4A:
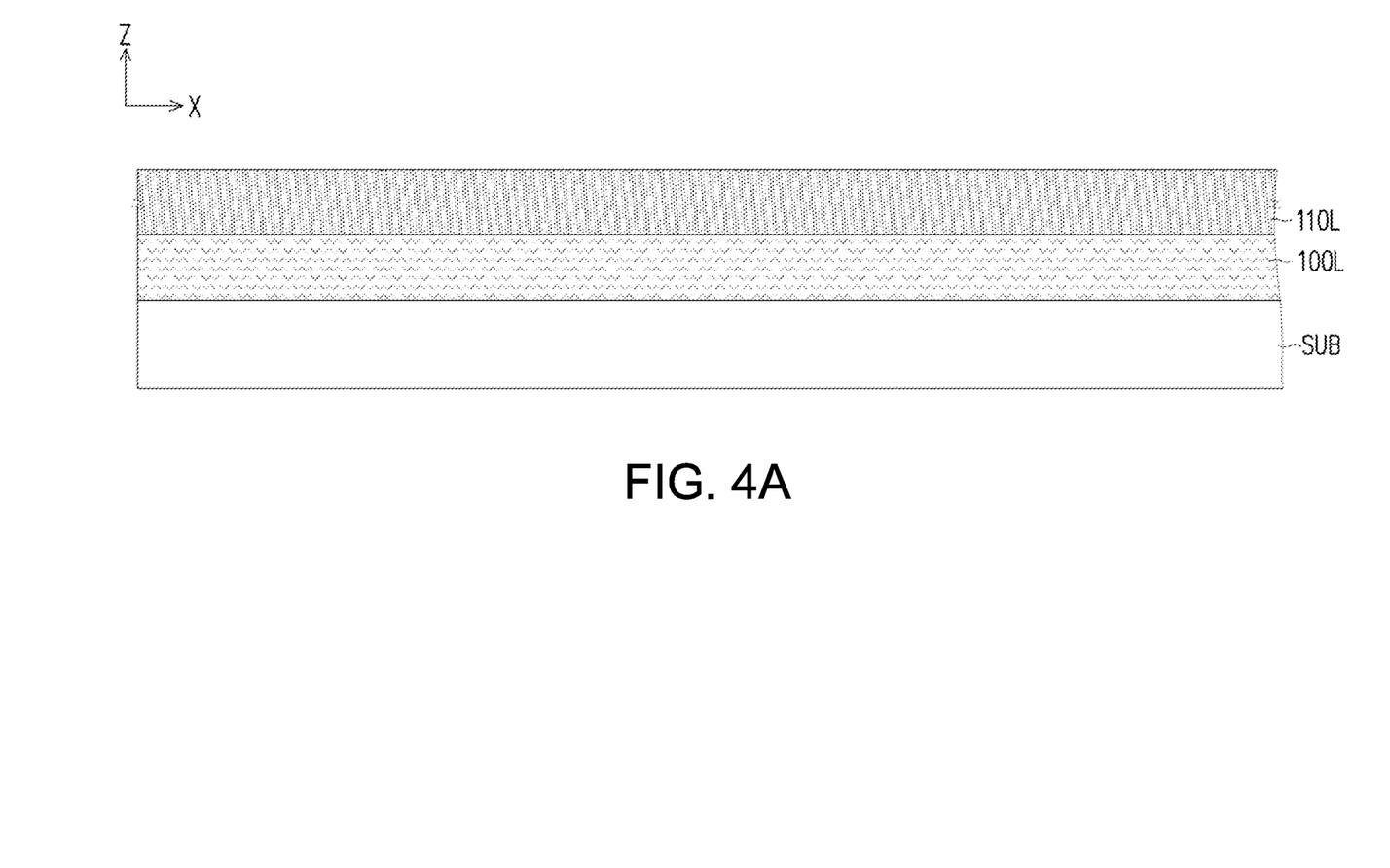
FIG. 4A to FIG. 4F are sectional schematic views of a manufacturing process of the tiling display apparatus of FIG. 2.
Figure 4B:
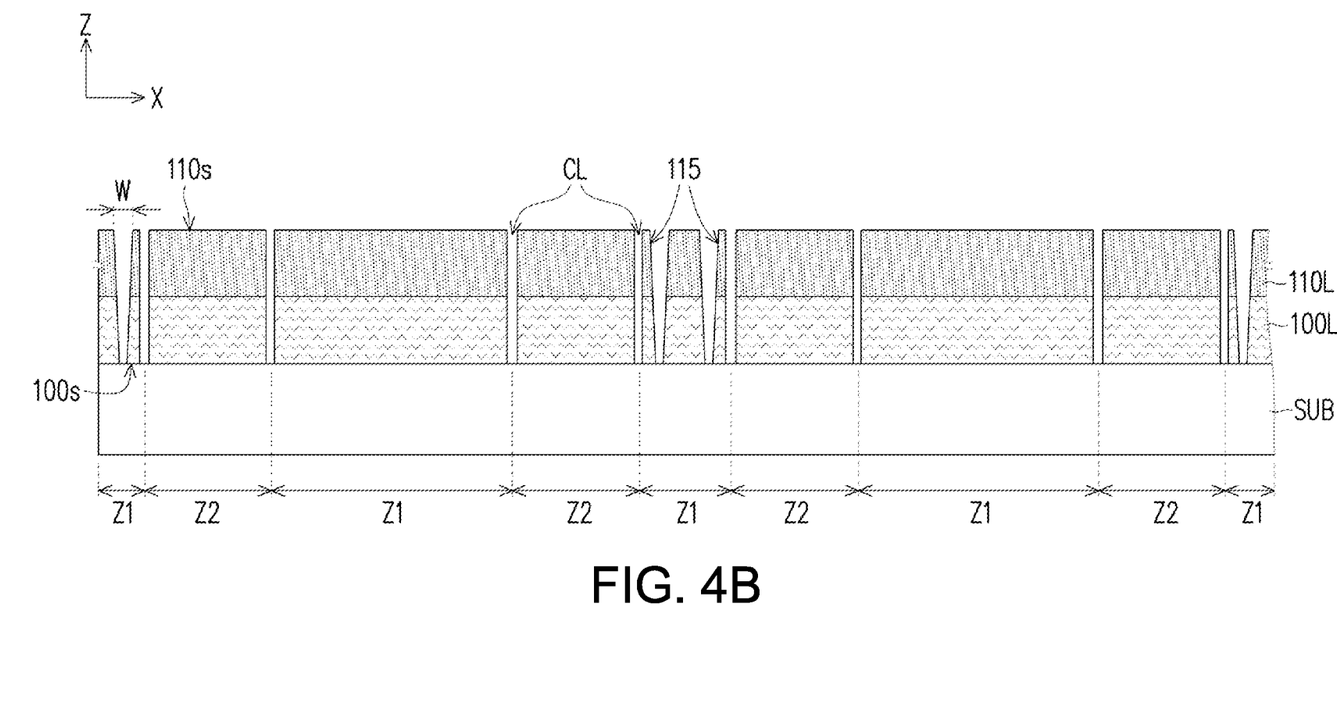

A manufacturing method of the tiling display apparatus 10 will be hereinafter described in an exemplary embodiment. As shown in FIG. 4A, a temporary substrate SUB is provided, and a substrate material layer 100L and an adhesive material layer 110L are formed on the temporary substrate SUB. Then, a plurality of positioning holes 115 and a plurality of cutting lines CL are formed in the substrate material layer 100L and the adhesive material layer 110L, as shown in FIG. 4B. The cutting lines CL may cut and divide the substrate material layer 100L and the adhesive material layer 110L into a plurality of regions Z1 and a plurality of regions Z2, where the regions Z1 are disposed with the positioning holes 115. For example, a lithographic etching process or a laser light source may be adopted to perform patterning (such as dot punching or cutting) to form the positioning holes 115 and the cutting lines CL, but the present disclosure is not limited thereto.

It should be particularly noted that, in another embodiment, the substrate material layer and the adhesive material layer may be provided without disposing the positioning holes 115, and instead, the subsequent positioning of the display unit 200 is performed using the cutting pattern formed by the cutting lines.

Figure 4C:
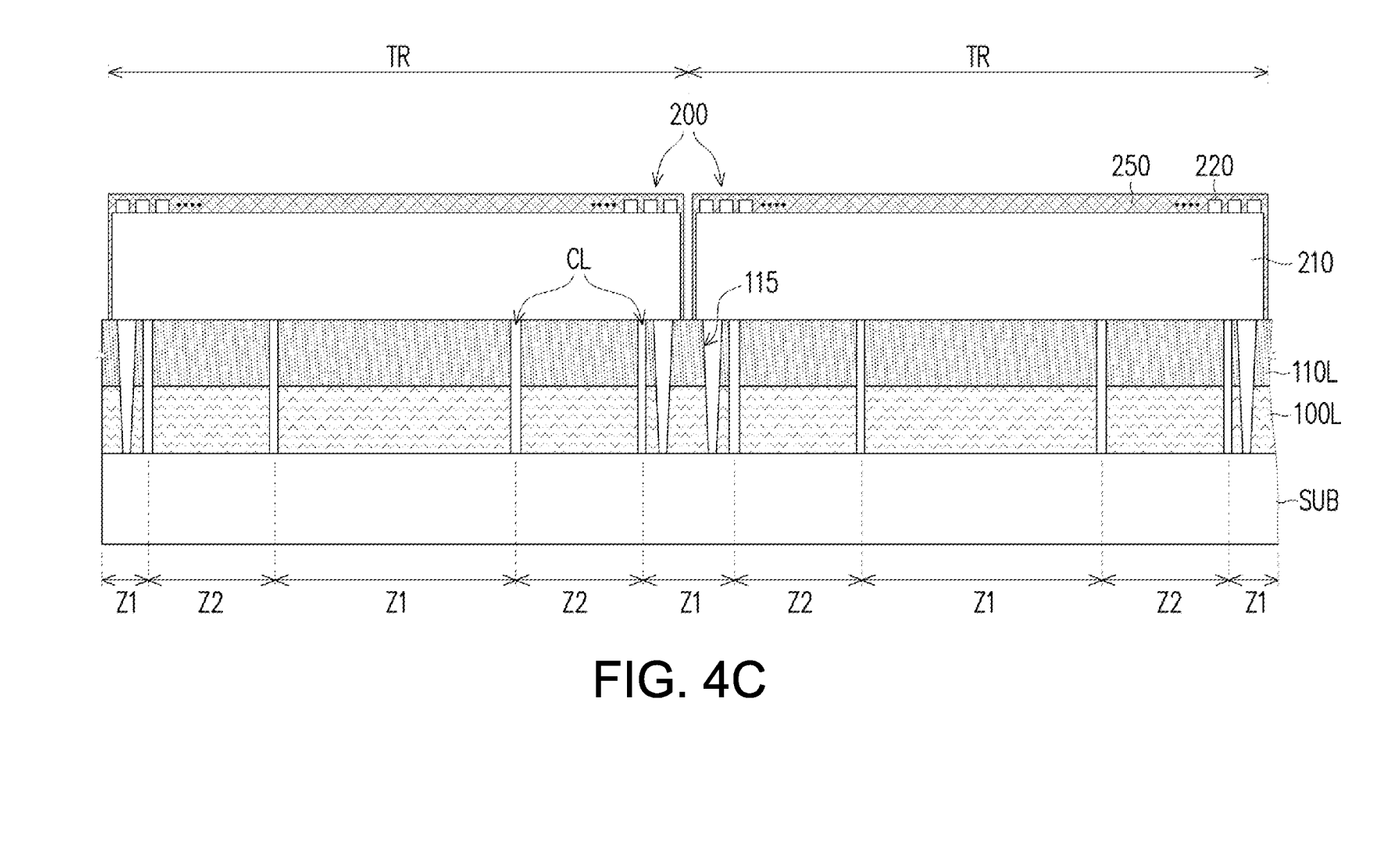
Figure 4D:
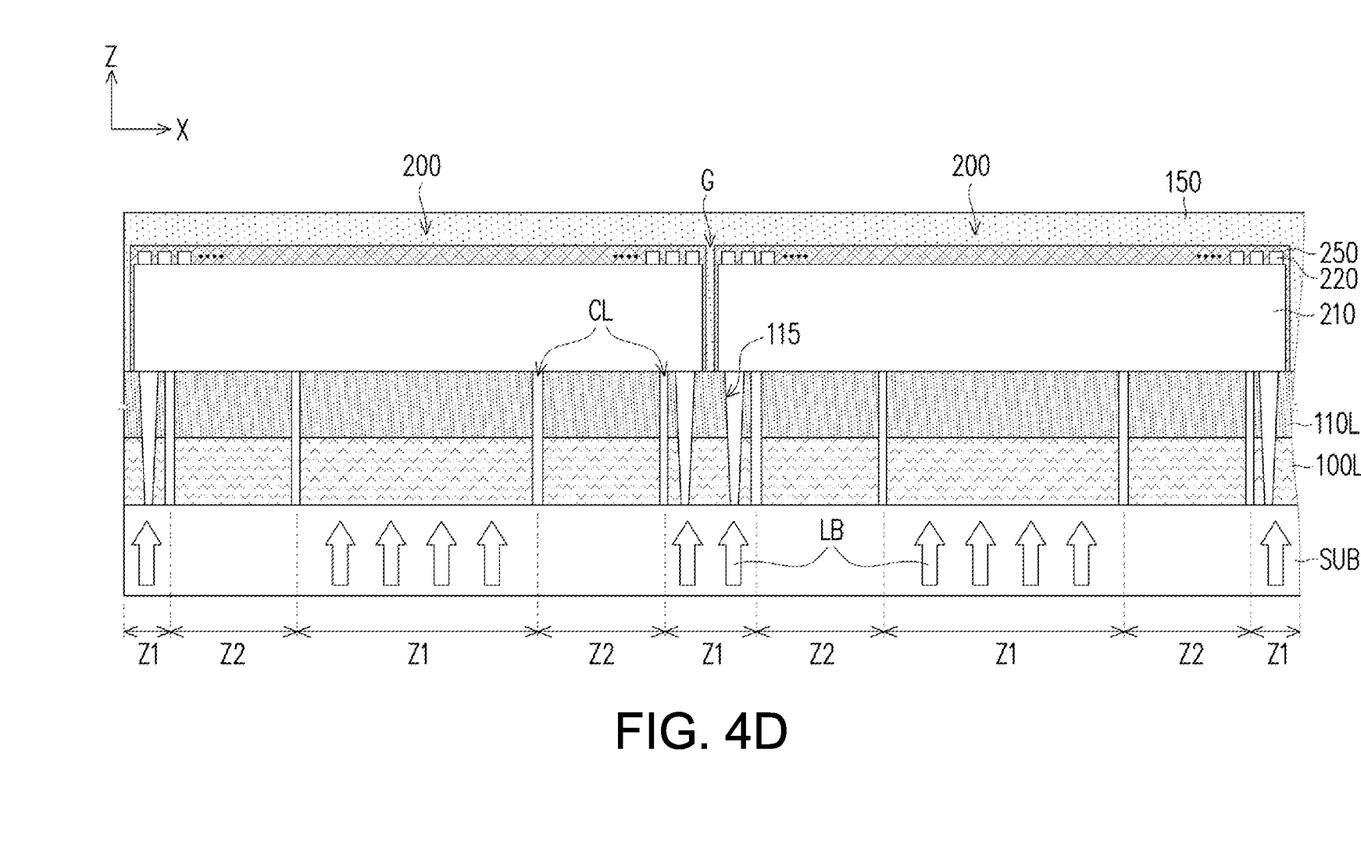
Figure 4E:
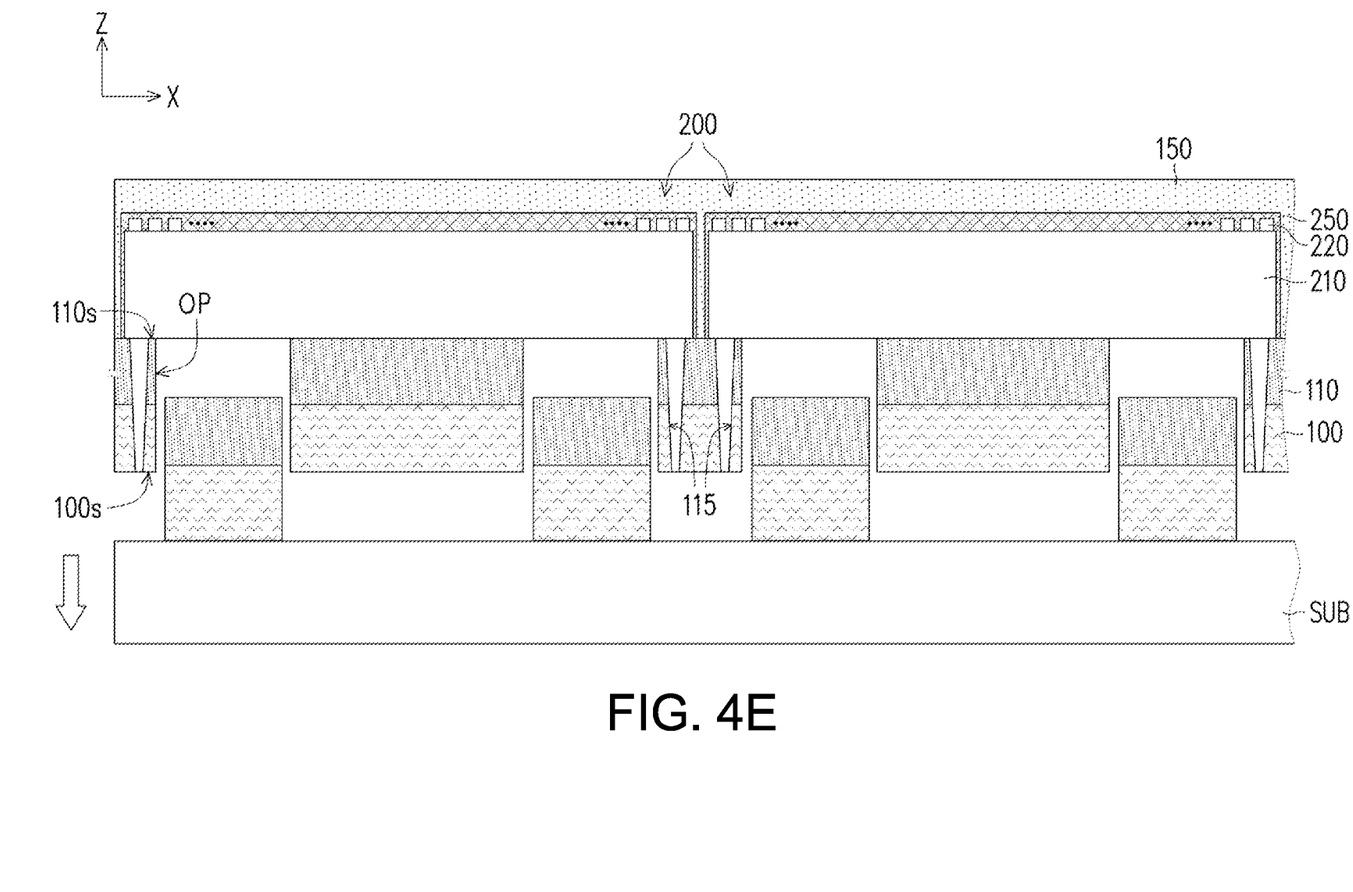
Figure 4F:
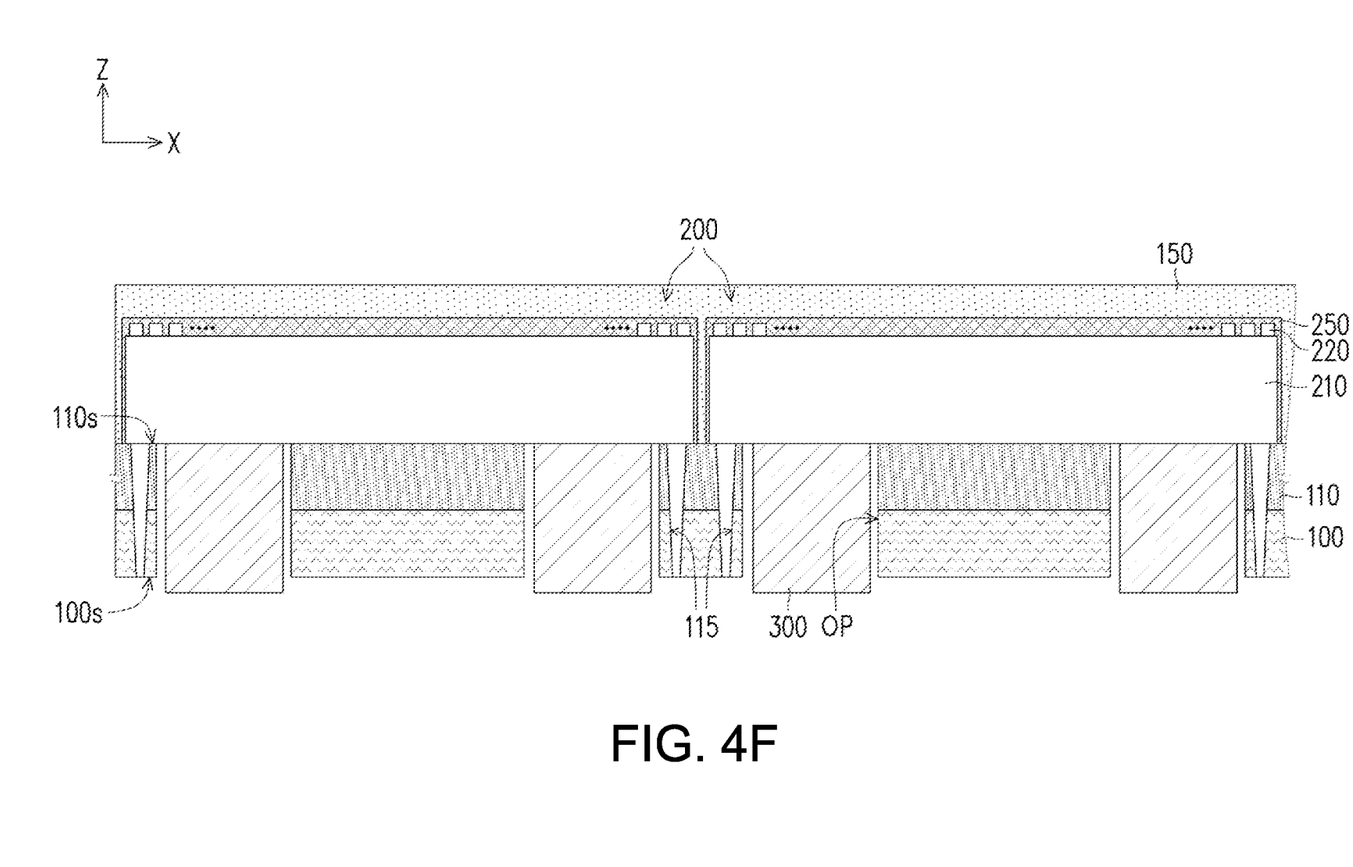

Referring to FIG. 4C, then, the transferring process of the display units 200 is performed. After each display unit 200 is transferred to the corresponding tiling region TR, alignment may be performed using the positioning holes 115, and the display units 200 may be attached onto the adhesive material layer 110L for fixing. After the transferring process of the display units 200 is complete, the second encapsulating adhesive layer 150 is formed, as shown in FIG. 4D. The second encapsulating adhesive layer 150 covers the display units 200 and is filled in the tiling gap G between any two adjacent display units 200. The material of the second encapsulating adhesive layer 150 may include acrylic resin or epoxy resin, etc. Then, the removing process of the temporary substrate SUB is performed. For example, prior to removing the temporary substrate SUB, the portions of the substrate material layer 100L in the regions Z1 are performed with light emission (for example, performing emission using laser light LB, without being limited thereto), such that the attaching force between the portions of the substrate material layer 100L and the temporary substrate SUB is reduced. Referring to FIG. 4D and FIG. 4F, since the portions of the substrate material layer 100L in the regions Z2 are not performed with light emission, the attaching force between these portions of the substrate material layer 100L and the temporary substrate SUB maintains unchanged. When the temporary substrate SUB is detached toward a direction away from the display units 200 (such as an opposite direction of the direction Z), the portions of the substrate material layer 100L and the adhesive material layer 110L are altogether removed, thus forming the substrate 100 and the adhesive layer 110 having a plurality of openings OP.

Referring to FIG. 4F, after the removing process of the temporary substrate SUB is complete, the bonding process of the driver chips 300 is performed. The driver chips 300 are electrically bonded to the display units 200 through the openings OP of the substrate 100 and the adhesive layer 110. In the present embodiment, the manufacturing method of the tiling display apparatus 10 may further selectively include: performing attaching of the transparent cover plate 190, where the transparent cover plate 190 may be attached to the second encapsulating adhesive layer 150 through an adhesive layer 170, as shown in FIG. 2. For example, when the substrate 100 is a flexible substrate, to increase the bonding yield of the driver chips, the attaching step of the transparent cover plate 190 may be performed prior to the bonding process of the driver chips 300 to increase the stiffness of the overall structure, without being limited thereto. Thus, the manufacturing of the tiling display apparatus 10 is complete.

In sum, in the tiling display apparatus according to one embodiment of the present disclosure, the substrate and the adhesive layer being used to tile the display units have the openings disposed corresponding to the display units, and the driver chips are electrically bonded to the display units through the openings. In addition, in the tiling process of the display units, the openings may function as alignment marks simultaneously, thus contributing to increasing the tiling accuracy of the display units. In other words, the widths of the tiling gaps of the display units can be reduced, thereby reducing the discontinuity of the tiling display image.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A tiling display apparatus, comprising:
a substrate;
a plurality of display units, disposed on the substrate, wherein each of the display units has a circuit substrate, a plurality of light emitting devices and at least one bonding pad, the circuit substrate has a first surface and a second surface opposite to each other, the light emitting devices are disposed on the first surface, and the at least one bonding pad is disposed on the second surface and is electrically coupled to the light emitting devices;
an adhesive layer, connecting the substrate and the display units, wherein the substrate and the adhesive layer have a plurality of openings disposed corresponding to the display units, and the bonding pads of the display units are located in the openings; and
a plurality of driver chips, electrically bonded to the bonding pads of the display units through the openings;
wherein at least one of the substrate and the adhesive layer further has a positioning hole.

2. The tiling display apparatus according to claim 1, wherein the driver chips are respectively disposed in the openings, and the driver chips do not overlap with portions of the substrate and the adhesive layer defining the openings.

3. The tiling display apparatus according to claim 1, wherein the driver chips are not in contact with side walls of the substrate and the adhesive layer defining the openings.

4. The tiling display apparatus according to claim 1, wherein the positioning hole runs through the substrate and the adhesive layer.

5. The tiling display apparatus according to claim 4, wherein the substrate and the adhesive layer respectively have a substrate surface and an adhesive surface facing away from each other, the positioning hole runs through the substrate surface and the adhesive surface, and a width of the positioning hole along a direction parallel to the substrate gradually decreases from the adhesive surface toward the substrate surface.

6. The tiling display apparatus according to claim 1, wherein each of the display units further has a first encapsulating adhesive layer covering the light emitting devices.

7. The tiling display apparatus according to claim 6, wherein the first encapsulating adhesive layer has an encapsulating surface, each of the light emitting devices has a light emitting surface, a first height exists between the encapsulating surface and the first surface, a second height exists between the light emitting surface and the first surface, and the first height is greater than or equal to the second height.

8. The tiling display apparatus according to claim 6, further comprising:
a second encapsulating adhesive layer, covering the display units and filled between the display units.

9. The tiling display apparatus according to claim 8, wherein an optical density of the second encapsulating adhesive layer is less than an optical density of the first encapsulating adhesive layer.

10. A tiling display apparatus, comprising:
a substrate;
a plurality of display units, disposed on the substrate, wherein each of the display units has a circuit substrate, a plurality of light emitting devices, at least one bonding pad and a first encapsulating adhesive layer, the circuit substrate has a first surface and a second surface opposite to each other, the light emitting devices are disposed on the first surface, the at least one bonding pad is disposed on the second surface and is electrically coupled to the light emitting devices, and the first encapsulating adhesive layer covers the light emitting devices;
a second encapsulating adhesive layer, covering the display units and filled between the display units;
an adhesive layer, connecting the substrate and the display units, wherein the substrate and the adhesive layer have a plurality of openings disposed corresponding to the display units, and the bonding pads of the display units are located in the openings; and
a plurality of driver chips, electrically bonded to the bonding pads of the display units through the openings.

11. The tiling display apparatus according to claim 10, wherein an optical density of the second encapsulating adhesive layer is less than an optical density of the first encapsulating adhesive layer.

12. The tiling display apparatus according to claim 10, wherein the first encapsulating adhesive layer has an encapsulating surface, each of the light emitting devices has a light emitting surface, a first height exists between the encapsulating surface and the first surface, a second height exists between the light emitting surface and the first surface, and the first height is greater than or equal to the second height.

13. The tiling display apparatus according to claim 10, wherein the driver chips are respectively disposed in the openings, and the driver chips do not overlap with portions of the substrate and the adhesive layer defining the openings.

14. The tiling display apparatus according to claim 10, wherein the driver chips are not in contact with side walls of the substrate and the adhesive layer defining the openings.

15. The tiling display apparatus according to claim 10, wherein at least one of the substrate and the adhesive layer further has a positioning hole, and the positioning hole runs through the substrate and the adhesive layer.

16. The tiling display apparatus according to claim 15, wherein the substrate and the adhesive layer respectively have a substrate surface and an adhesive surface facing away from each other, the positioning hole runs through the substrate surface and the adhesive surface, and a width of the positioning hole along a direction parallel to the substrate gradually decreases from the adhesive surface toward the substrate surface.

17. A tiling display apparatus, comprising:
a substrate;
a plurality of display units, disposed on the substrate, wherein each of the display units has a circuit substrate, a plurality of light emitting devices and at least one bonding pad, the circuit substrate has a first surface and a second surface opposite to each other, the light emitting devices are disposed on the first surface, and the at least one bonding pad is disposed on the second surface and is electrically coupled to the light emitting devices;
an adhesive layer, connecting the substrate and the display units, wherein the substrate and the adhesive layer have a plurality of openings disposed corresponding to the display units, and the bonding pads of the display units are located in the openings; and
a plurality of driver chips, electrically bonded to the bonding pads of the display units through the openings, wherein the driver chips are respectively disposed in the openings, and the driver chips do not overlap with portions of the substrate and the adhesive layer defining the openings.

18. The tiling display apparatus according to claim 17, wherein each of the display units further has a first encapsulating adhesive layer covering the light emitting devices.

19. The tiling display apparatus according to claim 18, wherein the first encapsulating adhesive layer has an encapsulating surface, each of the light emitting devices has a light emitting surface, a first height exists between the encapsulating surface and the first surface, a second height exists between the light emitting surface and the first surface, and the first height is greater than or equal to the second height.

* * * * *